(12) United States Patent
Kummle et al.

(10) Patent No.: US 6,278,612 B1
(45) Date of Patent: Aug. 21, 2001

(54) HOUSING FOR ELECTRONIC UNITS

(75) Inventors: Wolfgang Kummle, Salem; Dieter Stolle; Alfred Schreiber, both of Überlingen, all of (DE)

(73) Assignee: Bodenseewerk Geratetechnik GmbH, Uberlingen/Bodensee (DE)

( * ) Notice: Subject to any disclaimer, the term of this patent is extended or adjusted under 35 U.S.C. 154(b) by 0 days.

(21) Appl. No.: 09/655,298

(22) Filed: Sep. 5, 2000

(30) Foreign Application Priority Data

Sep. 8, 1999 (DE) ................................ 199 42 826

(51) Int. Cl.$^7$ ..................................... H05K 7/20
(52) U.S. Cl. ............... 361/719; 220/4.21; 312/223.1; 361/704
(58) Field of Search .................. 361/690, 704, 361/707, 709–711, 715–719; 312/223.1, 298, 236, 351.4; 454/184; 220/4.02, 4.21, 4.28, 4.31, 4.32, 8, 604, 617, DIG. 25

(56) References Cited

U.S. PATENT DOCUMENTS

| | | | |
|---|---|---|---|
| 4,027,206 | * 5/1977 | Lee | 361/697 |
| 4,656,559 | * 4/1987 | Fathi | 361/721 |
| 5,461,542 | * 10/1995 | Kosak et al. | 361/710 |
| 5,999,406 | * 12/1999 | McKain et al. | 361/704 |

* cited by examiner

Primary Examiner—Gerald Tolin
(74) Attorney, Agent, or Firm—Lawrence G. Fridman

(57) ABSTRACT

The invention relates to a housing for electronic units having printed circuit boards and heat sinks attached to said printed circuit boards. The housing comprises side walls formed by a first and a second u-shaped-section each having a central portion and a first and a second side cheek extending perpendicularly to the central portion. The u-shaped-sections extend into each other with clearance along longitudinal edges of the side cheeks. The central portions of the u-shaped-sections are connected to opposite end faces of the heat sinks. This results in an inexpensive construction with stability in dimensions. The heat transmission between the heat sinks and the housing is good.

6 Claims, 4 Drawing Sheets

HOUSING FOR ELECTRONIC UNITS

BACKGROUND OF THE INVENTION

This invention relates to a housing for electronic units having printed circuit boards and heat sinks attached to the printed circuit boards.

Electronic units or devices have printed circuit boards mounted in a housing. Electric and electronic components are mounted on the printed circuit boards. In operation, the components generate heat which has to be dissipated. To this end it is known to mount heat sinks on the side of the printed circuit boards. These heat sinks take up the generated heat. Due to the high heat capacity of the heat sinks, the heat sinks are not heated up very strongly. The heat sinks are connected to the housing such that the heat taken up by the heat sinks is dissipated to the housing. The housing has to have good stability in dimensions such that can be reliably mounted in fixing devices.

German patent 38 41 893 discloses a power circuit module for motor vehicles. This modules has a housing which is open on one side and accommodates a printed circuit board. The housing opening is closed by a housing cover connected to the printed circuit board. The dissipation of heat from the electronic components provided on the printed circuit board is effected through a cooling body designed in a particular manner. The cooling body comprises an assembly of rod-shaped carriers having a T-profile. The individual carriers are arranged in parallel side by side in a fixing device attached to the printed circuit board and form a substantially closed heat contact surface, which thermally engages the inside of a metallic outer wall of the housing.

German utility model 92 13 671 discloses a housing for an electronic circuit arrangement. This housing comprises at least two housing portions and is suitable for cooling electrical components. This housing is designed to establish a simple thermal connection between the housing and an electrical component. This is effected through a supporting spring attached to one of the housing portions. The supporting spring urges the electrical component against the inner wall of the other housing portion.

German patent application 42 42 944 A1 discloses an electrical device having a multiple-portion housing. Several printed circuit boards and power components to be cooled are arranged in at least two housing portions. Supporting springs urge the power components against the inner wall or extensions of the housing which leads to elimination of loss heat.

German patent 197 00 558 discloses a housing for electronic components. The housing consists of two groove-shaped semi-shells. The semi-shells have locating grooves and ledges which fit to each other in pairs such that screw passages are formed, into which a front plate extends. This front plate holds the semi-shells together. This ensures that the housing is held together after the semi-shells have been pushed together.

SUMMARY OF THE INVENTION

One of the objects of the present invention is to construct a housing for electronic units by using simple means, the housing having stability in its dimensions and ensuring a good heat transmission between the heat sinks and the housing.

These and other objects are achieved by a housing for electronic units having printed circuit boards and heat sinks attached to the printed circuit boards. The housing comprises side walls formed by a first and a second u-shaped-section each having a central portion and a first and a second side cheek extending perpendicularly to said central portion. The u-shaped-sections extend into each other with clearance along longitudinal edges of the side cheeks. The central portions of the u-shaped-sections are connected to opposite end faces of the heat sinks.

This results in the dimensions of the housing being defined by the dimensions of the heat sinks. A good heat transmission between the heat sinks and the housing is always ensured. Thus, the tolerances of the u-shaped-sections are not critical.

In one embodiment of the invention, the u-shaped-sections can be of identical shape and asymmetrical with respect to a central plane thereof. In this embodiment, the u-shaped-sections can have a groove along an edge of a first side cheek and a ledge along an edge of a second side cheek, the u-shaped-sections being assembled displaced by 180° such that the ledge on the first side cheek of a first u-shaped-section extends into the groove of the second side cheek of a second u-shaped-section and the ledge on the first side cheek of the second u-shaped-section extends into the groove of the second side cheek of the first u-shaped-section.

The u-shaped-section can be provided with dovetail guides on outer sides of the u-shaped-sections.

Further objects and features of the invention will be apparent to a person skilled in the art from the following specification of a preferred embodiment when read in conjunction with the appended claims.

BRIEF DESCRIPTION OF THE DRAWING

The invention and its mode of operation will be more clearly understood from the following detailed description in conjunction with the accompanying drawings in which.

DESCRIPTION OF THE PREFERRED EMBODIMENT

Figure 1:
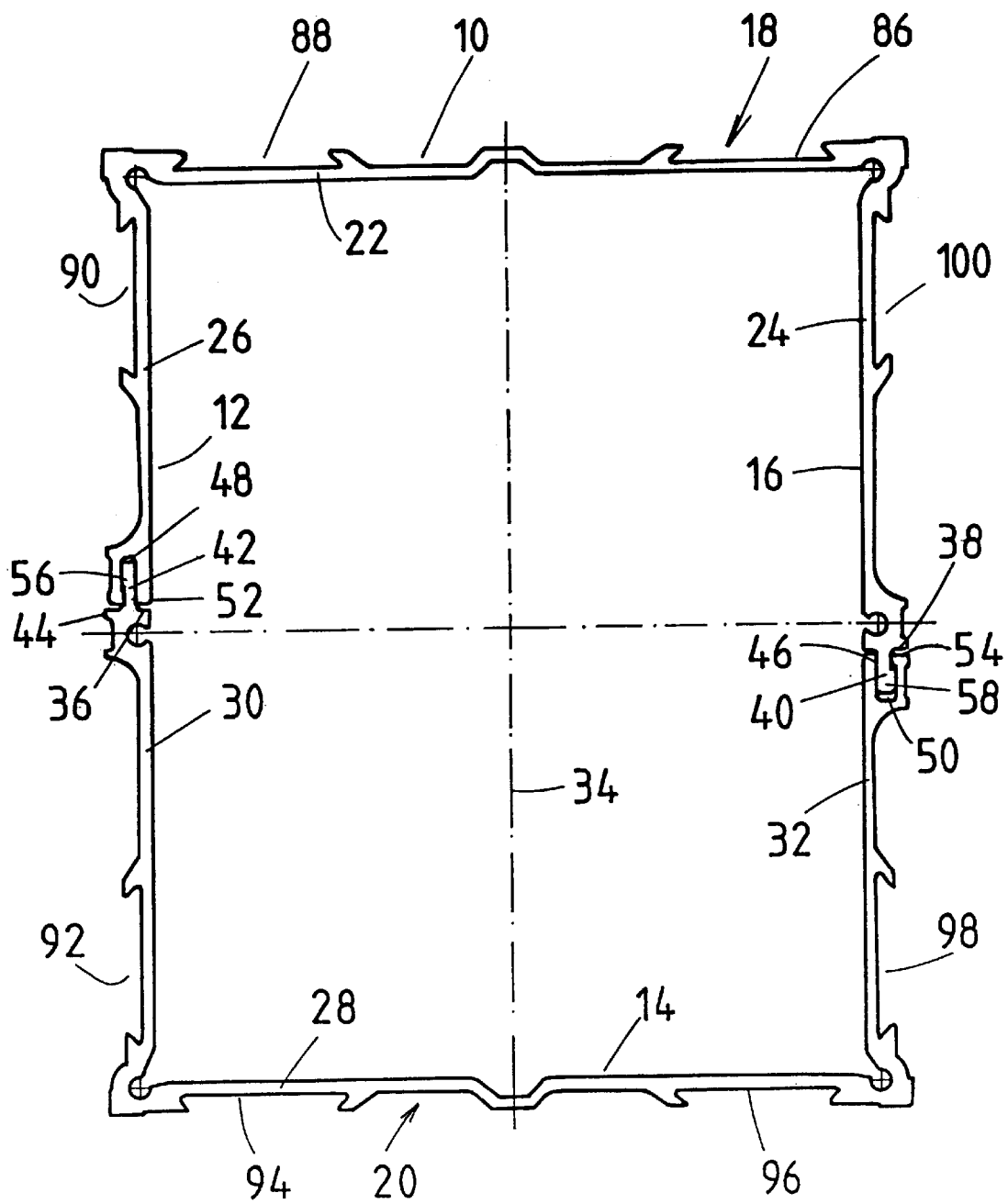
FIG. 1 shows the cross section of a housing comprising two extruded sections.

Referring now to FIG. 1, there is shown a cross section of a rectangular casing having four side walls 10, 12, 14 and 16 of a housing for electronic units. The four side walls are formed by angular u-shaped-sections 18 and 20. The u-shaped-sections are manufactured as extruded sections. The u-shaped-section 18 has a central portion 22, a first side cheek 24 and a second side cheek 26. The u-shaped-section 20 has a central portion 28, a first side cheek 30 and a second side cheek 32. The central portions 22 and 28 form two opposite side walls 10 and 14. The aligned side cheeks 26 and 30 together form the side wall 12 perpendicular to the side walls 10 and 12. The aligned side cheeks 24 and 32 together form the side wall 16 opposite to the side wall 12 and likewise perpendicular to the side walls 10 and 12.

Figures 2, 5:
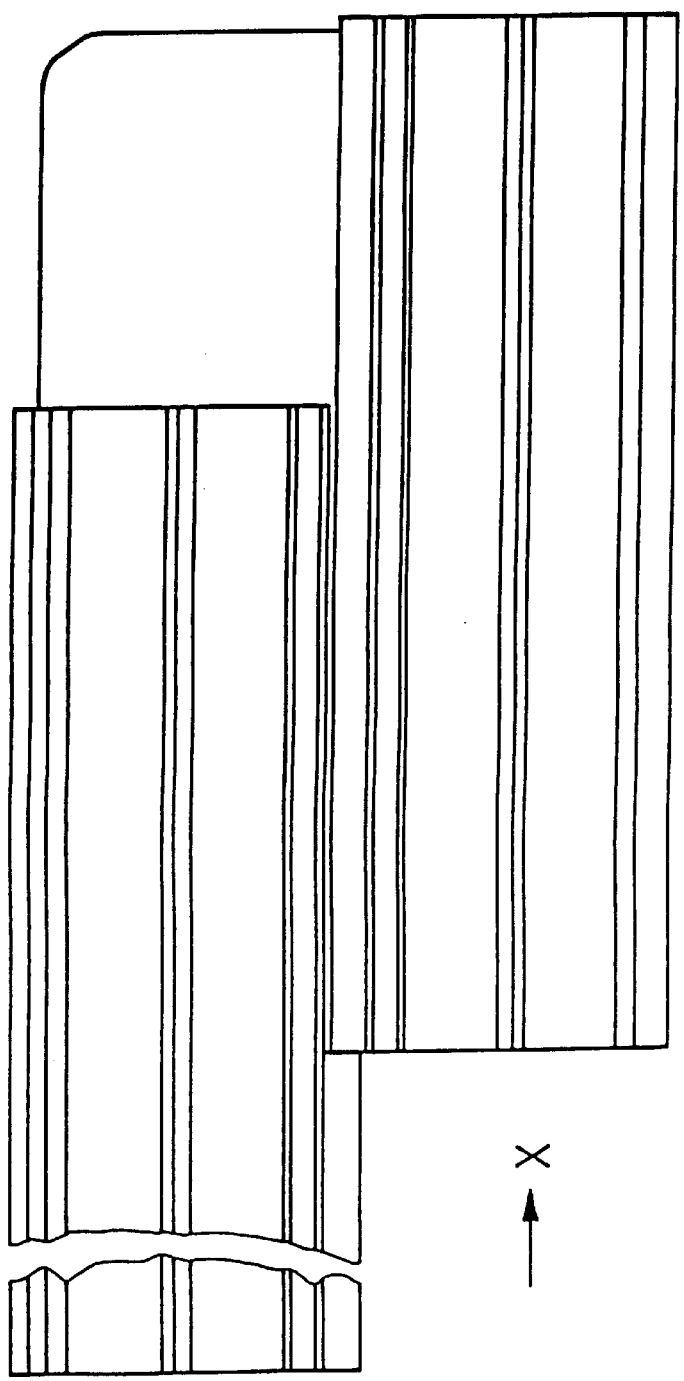
FIG. 2 is a side view of the housing and illustrates how the two housing halves are put together.
FIG. 5 shows a cover which closes the housing on a end face thereof.

The two u-shaped-sections 18 and 20 have identical shape and are asymmetrical with respect to their central line 34. The free longitudinal edges 36 and 38 of the first side cheeks 24 and 30, respectively, have a projecting ledge 40 and 42, respectively. The free longitudinal edges 44 and 46 of the second side cheeks 26 and 32, respectively, form grooves 48 and 50, respectively. The ledges 40 and 42 of the side cheeks 24 and 30, respectively, extend into the grooves 50 and 48, respectively, of the side cheeks 26 and 32, respectively, of the respective other u-shaped-section 20 and 18, respectively. At their opening the grooves 48 and 50 are slightly narrowed by a longitudinal enlargement 52 and 54, respectively. Each of the ledges 42 and 40 has a longitudinal enlargement 56 and 58, respectively. Thus, the ledges 42 and 40 can only be pushed into the grooves 48 and 50, respectively, from the end face, as illustrated in FIG. 2.

The two u-shaped-sections are protected from being pulled apart in the assembled state. The ledges 42 and 40 are held in the grooves 48 and 50, respectively, by the enlargements 52, 56 and 54, 58, respectively. As can be seen from FIG. 1, the grooves 48 and 50 are slightly deeper than the height of the associated ledges 42 and 40, respectively. Thus, the two u-shaped-sections 18 and 20 are held vertically with some clearance shown in FIG. 1.

Figure 3:
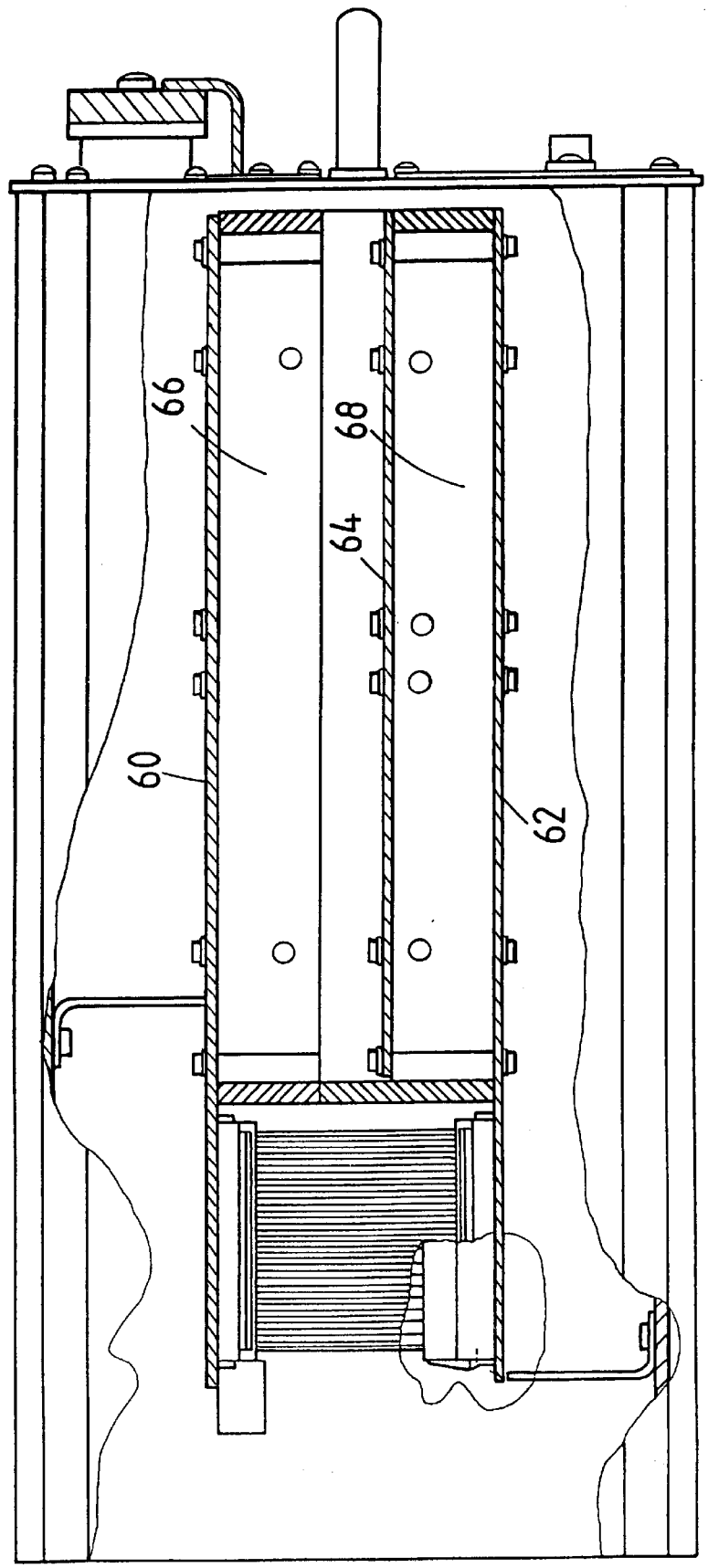
FIG. 3 is a view of the electronic device from the top in FIG. 2, parts of the upper side of the housing being removed.
Figure 4:
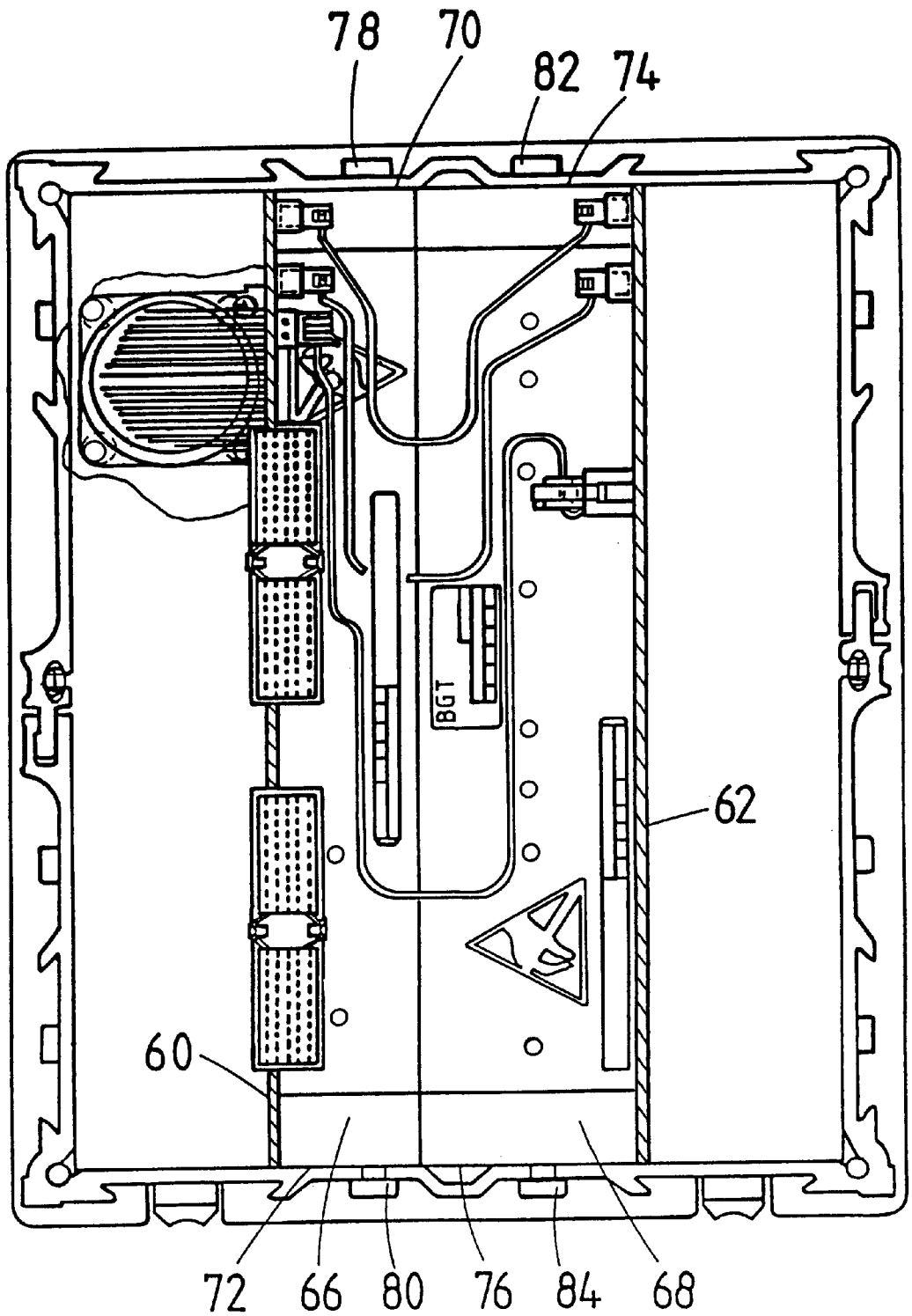
FIG. 4 is a view from the left in FIG. 3.

As can be seen from FIGS. 3 and 4, the electronic unit has three printed circuit boards 60, 62 and 64 in the described embodiment. The printed circuit boards are provided with electrical and electronic components. The particular type and circuitry of these components are irrelevant for the present invention and, therefore, are not described in detail. These electrical and electronic components generate heat which has to be dissipated through the housing.

To this end, heat sinks 66 and 68, respectively, are located on the backsides of the printed circuit boards 60 and 62. The heat sinks 66 and 68 have rectangular shape. The printed circuit board 64 is located on the back of the heat sink 68, remote from the printed circuit board 62. As can be seen from FIGS. 3 and 4, the printed circuit boards extend parallel to the side cheeks and between the central portions 22 and 28 of the housing casing. Correspondingly, also the heat sinks 66 and 68 extend parallel to the side cheeks between the central portions 22 and 28. The heat sinks 66 and 68 are machined with high accuracy. The height of the heat sinks 66 and 68 between the end faces 70, 72 and 74, 76, respectively, is exactly defined. The heat sinks 66 and 68 are connected with these end faces 70, 72 and 74, 76, respectively, to the central portions 22 and 28, respectively. The connection is effected through screws 78, 80 and 82, 84.

The housing is covered by covers 86 at the end faces, as illustrated in FIG. 5. The covers 86 secure the two u-shaped-sections in longitudinal direction and prevent them from being pulled apart, as illustrated in FIG. 2.

The described design offers several advantages: The housing is manufactured of inexpensive extruded portions. Nevertheless, highly exact dimensions of the housing are ensured in that these extruded portions are screwed together with the heat sinks 66, 68 having exact dimensions. By the clearance between the u-shaped-sections 18 and 20, a safe contact without air gap is ensured between the u-shaped-sections and the heat sinks 66, 68, such that heat can be safely eliminated through the housing. The u-shaped-section 18 and 20 are provided with dovetail guides 86, 88, 90, 92, 94, 96, 98 and 100 on the outside. By means of these dovetail guides the housing thus formed in this manner can be supported together with any structures interacting with the dovetail guides.

We claim:

1. A housing for electronic units having printed circuit boards and heat sinks attached to said printed circuit boards and having end faces, said housing comprising side walls formed by a first and a second u-shaped-section each having a central portion and a first and a second side cheek extending perpendicularly to said central portion and having longitudinal edges, wherein said u-shaped-section extend into each other with clearance along said longitudinal edges of said side cheeks and said central portions of said u-shaped-section are connected to opposite end faces of said heat sinks.

2. A housing for electronic units having printed circuit boards and heat sinks formed with end faces, said heat sinks being attached to said printed circuit boards, said housing comprising:

side walls formed by first and second u-shaped sections, each said u-shaped section containing a central portion and first and second side cheeks extending transversely to said central portion and having longitudinal edges, wherein said unshaped sections extend into each other forming a clearance along said longitudinal edges of said side cheeks, and said central portions of said u-shaped sections are connected to the opposite end faces of said heat sinks.

3. The housing of claim 2, wherein in each said u-shaped section said first and second side cheeks extend substantially perpendicularly to the respective central portion, and said first and second u-shaped sections are substantially identical in shape and asymmetrical relative to a respective central plane.

4. The housing of claim 2, wherein each said u-shaped section has a groove along the longitudinal edge of said second side cheek and a ledge along the logtitudinal edge of said first side cheek, in an assembled condition of said housing said ledge of said first side cheek of said first u-shaped section extends into said groove of said second side cheek of said second u-shaped section and said ledge of said first side cheek of said second u-shaped section extends into said groove of said second side cheek of said first u-shaped section.

5. The housing of claim 2, wherein said u-shaped sections have outer sides adapted to receive dovetail guides.

6. The housing of claim 4, wherein during assembly said first and second unshaped sections are displaced at about 180° to each other, so as to form an interior area of said housing having a substantially rectangular configuration.

* * * * *